United States Patent [19]

Ando et al.

[11] 4,048,372
[45] Sept. 13, 1977

[54] COATING OF CADMIUM STANNATE FILMS ONTO PLASTIC SUBSTRATES

[75] Inventors: Hiei Ando; Gottfried Haacke, both of Stamford, Conn.

[73] Assignee: American Cyanamid Company, Stamford, Conn.

[21] Appl. No.: 661,884

[22] Filed: Feb. 27, 1976

[51] Int. Cl.² .................. C01G 11/00; D01K 1/00; H01L 15/02
[52] U.S. Cl. .................................... 428/412; 29/572; 136/89; 204/129; 252/62.3 BT; 252/62.3 R; 423/593; 427/248 R; 423/618; 428/446; 428/500; 428/539
[58] Field of Search ............... 427/74, 108, 109, 110, 427/248 R, 419 A, 419 B, 419 C, 322, 93, 126; 428/500, 539, 412, 469, 472, 446; 136/89; 29/572; 204/129; 252/62.3 R, 62.3 BT; 423/593; 432/618

[56] References Cited
U.S. PATENT DOCUMENTS

| | | | |
|---|---|---|---|
| 2,581,632 | 1/1952 | Colbert et al. | 428/469 X |
| 3,368,919 | 2/1968 | Casale et al. | 428/469 X |
| 3,811,953 | 5/1974 | Nozik | 423/593 X |

*Primary Examiner*—Michael R. Lusignan
*Attorney, Agent, or Firm*—John L. Sullivan

[57] ABSTRACT

Light transmissive, electrically conductive cadmium stannate films on plastic substrates are greatly improved with respect to their adherence to the substrate if the film is deposited on a substrate which has been precoated with a metal oxide, such as silicon dioxide or titanium dioxide.

8 Claims, No Drawings

COATING OF CADMIUM STANNATE FILMS ONTO PLASTIC SUBSTRATES

This invention relates to light transmissive, electrically conductive cadmium stannate films or coatings. More particularly, it is concerned with an improved method for depositing such films on polymeric substrates. It is also concerned with the provision of improved plastic supported films having improved physical adhesion to the supporting substrate.

In recent years the utilization of optically transparent and electrically conductive coatings has become of increasing practical importance. Applications of technical significance include display devices, photoconductive components, and solar photovoltaic cells. Until recently, thin layers of doped tin oxide or indium oxide were the only materials which met the requirements for reliable practical operation. Now, a third material, cadmium stannate, has become available (U.S. Pat. No. 3,811,953) which, in many respects, is superior to the two oxides mentioned above. Besides high visible transparency and low electrical sheet resistance, cadmium stannate has an unexpectedly high infra-red reflectivity which makes it also a useful component as a heat reflector in a variety of different applications, such as solar heat collectors, aircraft canopies and infra-red protective goggles.

For many applications transparent conductors are deposited onto glass substrates. The procedures for coating the materials onto glass substrates are straightforward and can employ techniques based on vacuum deposition, spray coating or chemical vapor deposition. Frequently, it is highly desirable to replace glass substrates by plastic materials to achieve weight reduction or better protection from breakage. In view of the low softening points of plastic materials, spray coating or chemical vapor deposition techniques, which require high temperatures, are not suitable for the deposition of transparent conductive coatings. Vacuum methods have to be employed instead. In the case of cadmium stannate, radio-frequency (RF) sputtering has been found to be most advantageous (U.S. Pat. No. 3,811,953).

If cadmium stannate is sputter coated onto polycarbonate or acrylic sheets, the films have poor physical adhesion to the substrates and in many cases reticulate. This effect is especially serious for thick cadmium stannate layers exceeding approximately 2000A. so that electrical sheet resistances smaller than 100 ohm/square are impossible to achieve. However, for many applications sheet resistances as low as 10 ohm/square or even lower are needed.

It has now been found that mechanically stable cadmium stannate coatings can be deposited by RF sputtering onto polymeric substrates if these substrates are first coated with an oxide interlayer. Oxide materials which have been found to be most suitable for this purpose include silicon monoxide, silicon dioxide, titanium dioxide, tantalum oxide, antimony oxide, magnesium oxide, chromium oxide and vanadium oxide. These oxides can be conveniently deposited onto the plastic sheets by either vacuum evaporation, sputtering or low-temperature chemical deposition. The latter method is especially attractive in view of its simplicity and low cost. The thickness of the oxide interlayer is not critical and can be as small as 500A. and as high as 10,000A.

EXAMAPLE 1

A silicon dioxide film (approximately 2000-3000A. thick) was evaporated onto a Lexan polycarbonate substrate. The film was clear and did not impair the optical transmission of the substrate. Subsequently, a layer of cadmium stannate was sputter coated onto the $SiO_2$ interlayer. The cadmium stannate film was clear having an average optical transmission of 80% between 5000A. and 10,000A. and an electrical sheet resistance of 8 ohm/square. The cadmium stannate film adhered well to the substrate and passed the standard tape adhesion test.

EXAMPLE 2

A clear, colorless silicon dioxide film was evaporated onto a methylmethacrylate sheet followed by the sputter deposition of cadmium stannate. The resulting cadmium stannate coating had an average optical transmission of 80% between 5500A. and 10,000A. and 26 ohm/square electrical sheet resistance. The cadmium stannate film passed the tape adhesion test.

EXAMPLE 3

A titanium dioxide film was evaporated onto a polycarbonate (Lexan) substrate from a $tiO_2$ pressed powder pellet. The resulting film was clear and had a thickness of 500A. A cadmium stannate film was subsequently sputtered onto the $TiO_2$ interlayer. After one hour at 50 watts RF power a clear 27 ohm/square cadmium stannate film resulted. An additional one hour deposition lowered the sheet resistance to 12 ohm/square.

EXAMPLE 4

Tantalum oxide was evaporated onto Lexan sheet. A film thickness of 1400A. resulted. Sputter coating of cadmium stannate led to a 31 ohm/square film after one hour. A second one-hour deposition yielded a clear film with 12 ohm/square sheet resistance.

EXAMPLE 5

A silicone oxide film was coated onto polycarbonate from a solution containing the following ingredients:

|  | Parts by Weight |
|---|---|
| methylene chloride | 110 |
| tetraethylorthosilicate | 5 |
| ethyl acetate | 50 |
| ethyl alcohol | 50 |
| concentrated HCl | 5 |

The solution was spin-coated onto the substrate which was subsequently oven dried at 100° C. in air. A clear smooth silicon oxide film developed. Sputter coating of cadmium stannate onto the interlayer yielded a clear 20 ohm/square film which did not reticulate and passed the standard tape adhesion test.

EXAMPLE 6

A titanium oxide interlayer was deposited onto Lexan® from the following solution:

|  | Parts by Weight |
|---|---|
| ethyl acetate | 50 |
| ethyl alcohol | 50 |
| concentrated HCl | 5 |
| tetrabutyl titanate | 5 |

After spin-coating the sample was oven dried at 100° C. in air and a clear, smooth titanium oxide film formed. Subsequent coating with sputtered cadmium stannate resulted in a clear film with 15 ohm/square sheet resistance. The coating passed the tape adhesion test.

What is claimed is:

1. In the process for coating a polymeric substrate with a light transmissive, electrically conductive film of cadmium stannate, the improvement which comprises first coating the substrate with a film of a metal oxide, selected from silicon monoxide, silicon dioxide, titanium dioxide, tantalum oxide, antimony oxide, magnesium oxide, chromium oxide and vanadium oxide.

2. The process of claim 1 wherein the polymeric substrate is a polycarbonate or polymethylmethacrylate.

3. The process of claim 2 wherein the metal oxide is selected from silicon monoxide, silicon dioxide, titanium dioxide and tantalum oxide.

4. The process of claim 3 wherein the metal oxide interlayer is deposited by vacuum evaporation.

5. The process of claim 3 wherein the metal oxide interlayer is deposited by low temperature chemical deposition.

6. An electrically conductive, light transmissive device consisting of an electrically conductive, light transmissive film of cadmium stannate coated on a polymeric substrate pre-coated with a film of metal oxide selected from silicon oxide, dilicon silicon, titanium dioxide, tantalum oxide, antimony oxide, magnesium oxide, chromium oxide and vanadium oxide.

7. The device of claim 6 in which the metal oxide film is selected from silicon monoxide, silicon dioxide, titanium dioxide and tantalum oxide.

8. The device of claim 6 wherein the polymeric substrate is a polycarbonate or polymethylmethacrylate.

* * * * *